United States Patent
Kim et al.

(10) Patent No.: US 8,113,900 B2
(45) Date of Patent: Feb. 14, 2012

(54) METHOD OF MAKING ORGANIC LIGHT EMITTING DISPLAY DEVICE

(75) Inventors: Kwang-Min Kim, Suwon-si (KR); Won-Kyu Kwak, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/585,615

(22) Filed: Sep. 18, 2009

(65) Prior Publication Data
US 2010/0112887 A1  May 6, 2010

(30) Foreign Application Priority Data
Oct. 31, 2008  (KR) .................... 10-2008-0107549

(51) Int. Cl.
*H01J 9/24* (2006.01)
(52) U.S. Cl. .............. 445/24; 445/25; 313/504
(58) Field of Classification Search .......... 445/25, 445/24; 313/504, 512
See application file for complete search history.

(56) References Cited

U.S. PATENT DOCUMENTS

| | | | |
|---|---|---|---|
| 5,929,562 A * | 7/1999 | Pichler | 313/506 |
| 6,948,993 B2 * | 9/2005 | Yi et al. | 445/24 |
| 7,622,899 B2 * | 11/2009 | Yi et al. | 438/99 |
| 7,837,530 B2 * | 11/2010 | Park | 445/25 |
| 7,841,919 B2 * | 11/2010 | Lee et al. | 445/25 |
| 7,846,001 B2 * | 12/2010 | Song et al. | 445/25 |
| 2005/0046341 A1 * | 3/2005 | Ikeda et al. | 313/504 |
| 2006/0199461 A1 * | 9/2006 | Yamazaki et al. | 445/24 |
| 2007/0108889 A1 * | 5/2007 | Kim | 313/503 |
| 2008/0111479 A1 * | 5/2008 | Choi et al. | 313/504 |
| 2008/0160864 A1 * | 7/2008 | Song et al. | 445/3 |

FOREIGN PATENT DOCUMENTS

| | | |
|---|---|---|
| KR | 10-2002-0041212 | 6/2002 |
| KR | 10-0479525 B1 | 3/2005 |
| KR | 10-2006-0019792 | 3/2006 |
| KR | 10-0637065 B1 | 10/2006 |
| KR | 10-2007-0066261 | 6/2007 |
| KR | 10-2008-0065118 A | 7/2008 |
| KR | 10-0864885 B1 | 10/2008 |

OTHER PUBLICATIONS

Korean Office Action issued by the Korean Patent Office on Oct. 29, 2010 corresponding to Korean Patent Application No. 10-2008-0107549 and Request for Entry of the Accompanying Office Action attached herewith.
Korean Office action issued by KIPO on Nov. 30, 2011, corresponding to Korean Patent Application No. 10-2008-0107549 and Request for Entry attached herewith.

* cited by examiner

*Primary Examiner* — Nimeshkumar Patel
*Assistant Examiner* — Mary Ellen Bowman
(74) *Attorney, Agent, or Firm* — Robert E. Bushnell, Esq.

(57) ABSTRACT

A method of making an organic light emitting display device is capable of enhancing the accuracy of a lighting test. The method of making an organic light emitting display device comprises: forming at least one first panel on top of a large substrate and forming at least one second panel on a bottom of the large substrate; forming independent pads, each receiving and transferring power supply from the exterior to the panels formed on the large substrate, the number of independent pads being the same as the number of panels; and forming independent wires between the panels and pads, the independent wires between the panels and pads each having the same length.

10 Claims, 3 Drawing Sheets

METHOD OF MAKING ORGANIC LIGHT EMITTING DISPLAY DEVICE

CLAIM OF PRIORITY

This application makes reference to, incorporates the same herein, and claims all benefits accruing under 35 U.S.C. §119 from Korean Patent Application No. 10-2008-0107549 earlier filed in the Korean Intellectual Property Office on Oct. 31, 2008.

BACKGROUND OF THE INVENTION

1. Field of the Invention

The present invention relates to a method of making an organic light emitting display device, and more particularly to a method of making an organic light emitting display device capable of enhancing accuracy of a lighting test when forming a plurality of panels on a large substrate.

2. Related Art

Recently, various flat panel display devices having less weight and volume than a cathode ray tube have been developed. Such flat panel display devices include the liquid crystal display (LCD), the field emission display (FED), the plasma display panel (PDP), the organic light emitting display device, and the like.

Among others, the organic light emitting display device has various advantages in view of excellent color reproducibility, a small thickness, and the like so that its market has largely expanded to applications such as a PDA, an MP3, etc., in addition to a cellular phone.

The organic light emitting display device has a plurality of organic light emitting diodes (OLEDs) formed on a panel, the OLEDs determining the brightness of light corresponding to an amount of input current so as to display an image.

The OLEDs include red, green or blue light emitting layers positioned between an anode electrode and a cathode electrode, and they determine brightness depending on the amount of current flowing from the anode electrode to the cathode electrode.

The panel of an organic light emitting display device is obtained by forming a plurality of panels on a large substrate and cutting them after a lighting test.

Power is supplied to each panel when performing a lighting test in which, if a panel is formed on a large substrate, power supply lines vary in length according to the positions of the panel. Therefore, a magnitude of power supplied through the power supply line also differs, thereby causing a problem in that brightness variation of the panel occurs.

SUMMARY OF THE INVENTION

Therefore, it is an object of the present invention to provide a method of making an organic light emitting display device capable of enhancing the accuracy of a lighting test.

In order to accomplish the above object, according to a first aspect of the present invention, a method of making an organic light emitting display device includes: forming at least one panel on top of a large substrate, and forming at least one panel at a bottom of the large substrate; forming independent pads, each receiving and transferring a power supply from the exterior to the panels formed on the large substrate, the number of independent pads being equal to the number of panels; and forming independent wires between the panels and pads, the independent wires between the panels and pads having the same length.

In addition, each of the pads independently transfers the same power supply and the same driving signals to each of the plurality of panels.

Furthermore, images displayed on the panels formed on top of the large substrate, and images displayed on the panels formed at the bottom of the large substrate, are symmetrical with each other in the upward and downward directions.

In order to accomplish the above object, according to a first aspect of the present invention, a method of making an organic light emitting display device includes: forming first and second panels and third and fourth panels on top and on the bottom, respectively, of a large substrate; forming a first pad corresponding to the first panel, and first wires connecting the first panel to the first pad; forming a second pad corresponding to the second panel, and second wires connecting the second panel to the second pad; forming a third pad corresponding to the third panel, and third wires connecting the third panel to the third pad; and forming a fourth pad corresponding to the fourth panel, and fourth wires connecting the fourth panel to the fourth pad; the first wires, second wires, third wires and fourth wires having the same length.

In addition, the first to fourth pads receive the same power supply and the same driving signals for transfer to the first to fourth panels.

Furthermore, images displayed on the first and second panels and the images displayed on the third and fourth panels are symmetrical with each other in the upward and downward directions.

With the method of making an organic light emitting display device according to the present invention, the number of panels formed on the large substrate is the same as the number of pad parts supplying power supply and signals to the panels, making it possible to constitute the length of the wires connecting panels electrically to the pad parts. Accordingly, the voltage drop of the supplied power and signals becomes the same for each panel, making it possible to reduce the brightness deviation. Also, the power supply and signals inputted into each panel are transferred independently so that the number of power supplies made from both sides of the panels is the same as the number of panels receiving the power supply and signals, making it possible to reduce brightness variation.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
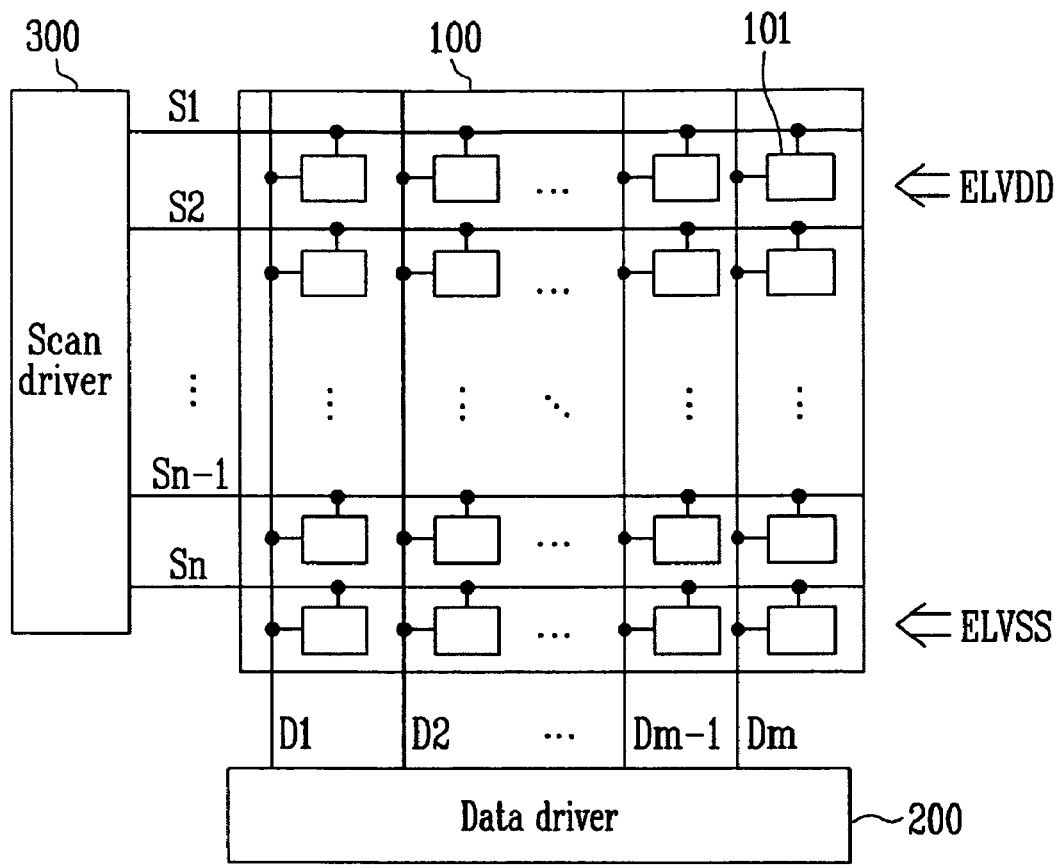
FIG. 1 is a structural view of an organic light emitting display device according to the present invention.

Hereinafter, certain exemplary embodiments according to the present invention will be described with reference to the accompanying drawings. Here, when a first element is describes as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

Hereinafter, exemplary embodiments of the present invention will be described with reference to the accompanying drawings.

FIG. 1 is a structural view of an organic light emitting display device according to the present invention. Referring to FIG. 1, the organic light emitting display device includes a pixel unit 100, a data driver 200, and a scan driver 300.

The pixel unit 100 is arranged with a plurality of pixels 101, wherein each pixel 101 includes an organic light emitting diode (not shown) which emits light corresponding to current flow. In the pixel unit 100, scan lines S1, S2, ... Sn−1, and Sn are formed in a row direction to transfer scan signals, and data lines D1, D2, ... Dm−1, and Dm are formed in a column direction to transfer data signals.

Also, the pixel unit 100 is driven by receiving a first power supply ELVDD and a second power supply ELVSS. Therefore, the pixel unit 100 emits light by allowing current to flow in the organic light emitting diode by virtue of the scan signals, data signals, first power supply ELVDD and second power supply ELVSS, thereby displaying an image.

The data driver 200, which is a means for generating data signals, generates data signals using image data signals having red (R), blue (B) and green (G) components. The data driver 200 applies the generated image data signals by connecting an output channel, outputting the image data signals to the data lines D1, D2, ... Dm−1, and Dm of the pixel unit 100, to the pixel unit 100.

The scan driver 300, which is a means for generating scan signals, is connected to scan lines S1, S2, ... Sn−1, and Sn so as to transfer scan signals to a specific row of the pixel 100. The data signals outputted from the data driver 200 are transferred to the pixel 101 with the scan signals so that voltage corresponding to the data signals is transferred to the pixel rejected under 35 U.S.C. §101 because the claimed invention is directed to non-statutory subject matter.

Figure 2:
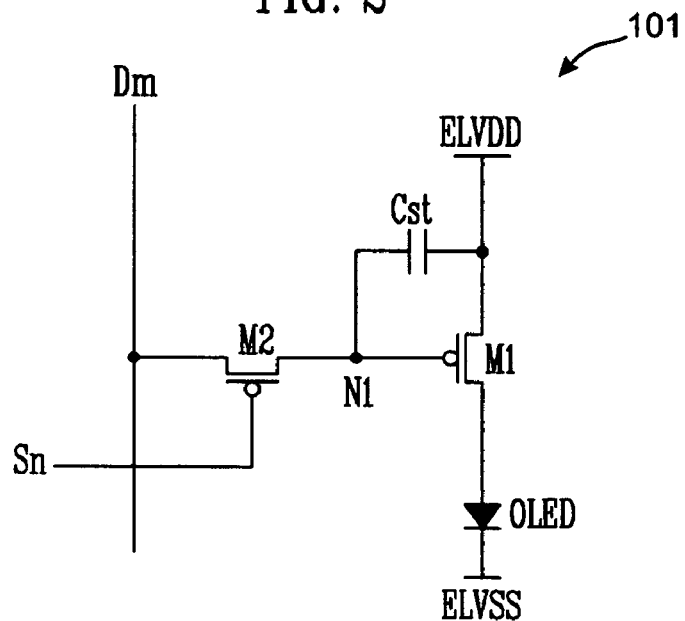
FIG. 2 is a circuit diagram showing a pixel adopted to the organic light emitting display device of FIG. 1.

FIG. 2 is a circuit diagram showing a pixel adopted to the organic light emitting display device of FIG. 1. Referring to FIG. 2, a pixel 101 includes a first transistor M1, a second transistor M2, a capacitor Cst, and an organic light emitting diode OLED.

The first transistor M1 has a source connected a first power supply ELVDD, a drain connected to an anode electrode of the organic light emitting diode OLED, and a gate connected to a first node N1. Such a first transistor M1 allows current corresponding to a voltage of the first node N1 to flow in a direction from the source to the drain.

The second transistor M2 has a source connected to a data line Dm, a drain connected to the first node N1, and a gate connected to a scan line Sn. Therefore, the second transistor M2 transfers, to the first node N1, a data signal corresponding to scan lines transferred through the scan line Sn.

The capacitor Cst has a first electrode connected to the first power supply ELVDD, and a second electrode connected to the first node N1. Therefore, the capacitor Cst maintains a voltage of the first node N1. In other words, the capacitor Cst allows the voltage of data signals to be maintained in the first node N1.

The organic light emitting diode OLED has an anode electrode connected to the drain of the first transistor M1, and a cathode electrode connected to the second power supply ELVSS. Therefore, the current flowing in a direction from the source of the first transistor M1 to the drain thereof flows in a direction from the anode electrode of the organic light emitting diode OLED to the cathode electrode thereof. Then, the organic light emitting diode OLED emits light having a brightness corresponding to the flowing current.

Figure 3:
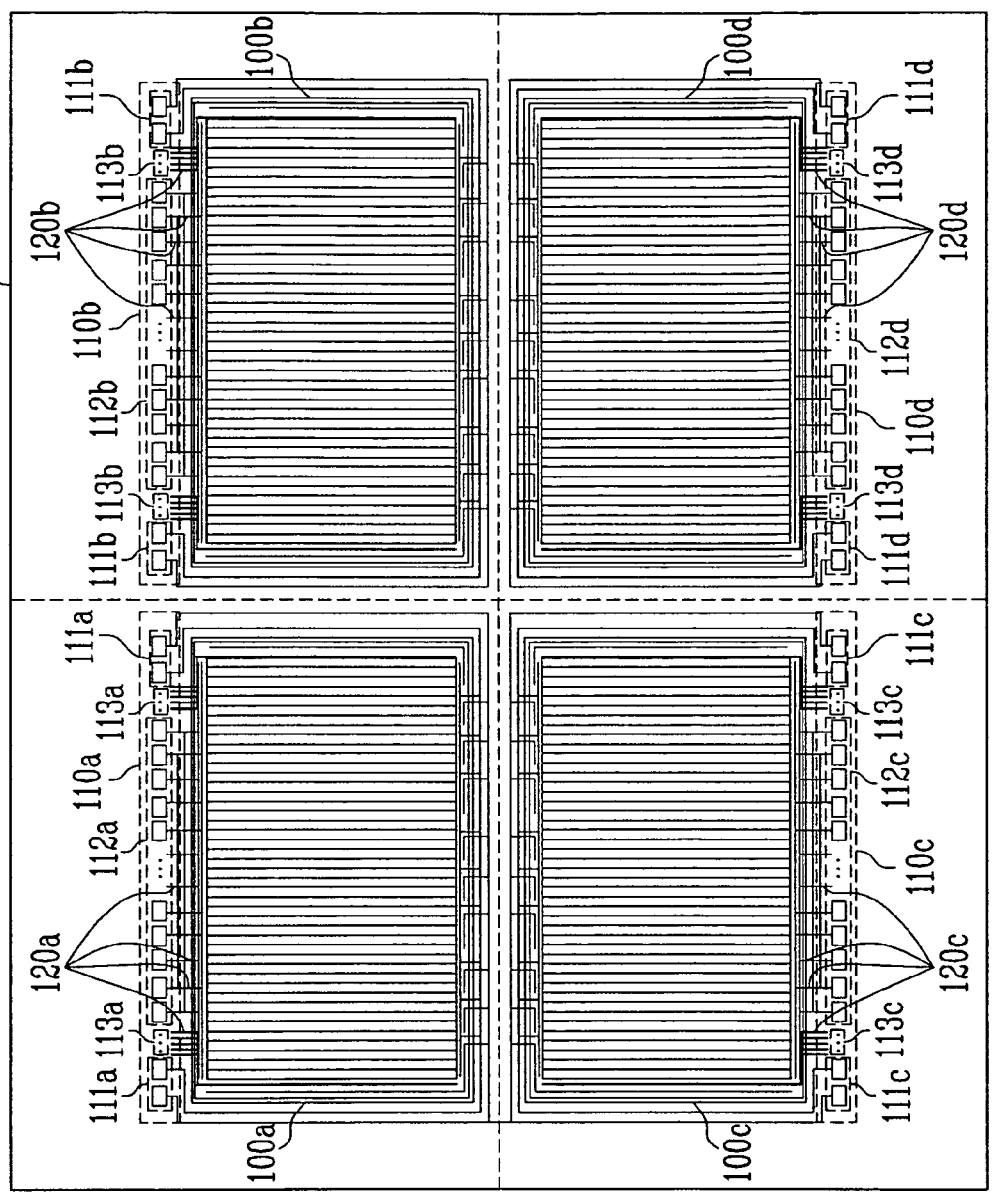
FIG. 3 is a view showing that a plurality of panels are formed on a large substrate.

FIG. 3 is a view showing that a plurality of panels are formed on a large substrate. Referring to FIG. 3, a panel is a pixel unit of an organic light emitting display device, but the panel may include a scan driver and a data driver.

First to fourth panels 100a, 100b, 100c, and 100d are formed on large substrate 1000, and first to fourth pad parts 110a, 110b, 110c, and 110d are formed so as to correspond to the first to fourth panels 100a, 100b, 100c, and 100d. Wires 120a, 120b, 120c, and 120d are formed in each panel so as to allow each pad part to electrically receive signals from the exterior. More specifically, the first to fourth pad parts 110a, 110b, 110c, and 110d are formed on the top and bottom of the horizontal side of the large substrate 1000. Such first to fourth pad parts 110a, 110b, 110c, and 110d include pads 111a, 111b, 111c, and 111d for transferring a first power supply ELVDD, pads 112a, 112b, 112c, and 112d for transferring a second power supply ELVSS, and signal pads 113a, 113b, 113c, and 113d for transferring signals such as scan signals, data signals and the like. Each of the power supplies and signals transferred through the first to fourth pad parts 110a, 110b, 110c, and 110d are transferred to the pads from the exterior through the wires 120a, 120b, 120c, and 120d.

At this point, the first and second pad parts 110a and 110b formed on the top of the large substrate 1000 and the third and fourth pad parts 110c and 110d disposed at the bottom of the large substrate 1000 are formed so as to be symmetrical with each other in the upward and downward directions. Therefore, images formed on the first and second panels 100a and 100b, and images formed on the third and fourth panels 100c and 100d, are formed so as to be symmetrical with each other in the upward and downward directions.

If the first to fourth pad parts 110a, 110b, 110c, and 110d are formed so as to correspond to the first and fourth panels 100a, 100b, 100c, and 100d as described above, wires 120a, 120b, 120c, and 120d for transferring signals to the pad parts are formed so as to have the same length. That is, the length of the wires 120a and 120b between the first and second pad parts 110a and 110b and the first and second pads 100a and 100b corresponding thereto becomes identical to the length of wires 120c and 120d between the third and fourth pad parts 110c and 110d and the third and fourth panels 100c and 100d corresponding thereto. As the lengths of the wires become identical as described, internal resistances of the wires become identical so that the deviation of voltage drop generated from the wires becomes identical. For this reason, the brightness deviation of images represented from the first to fourth panels 100a, 100b, 100c, and 100d is reduced. Also, the same image is displayed on the first to fourth panels 100a, 100b, 100c, and 100d at the time of the lighting test, making it possible to comprehend whether there is a defect in a pixel. Signals and power supply required in the lighting test are transferred for each panel so that each panel is driven independently so as not to be affected by the operations of other panels, making it possible to prevent generation of a malfunction.

Therefore, it is possible to easily comprehend whether there are defects in the first to fourth panels 100a, 100b, 100c, and 100d at the time of the lighting test. The large substrate 1000 is cut along the dots after the lighting test, thereby allowing the first to fourth panels 100a, 100b, 100c, and 100d to be separated.

Figure 4:
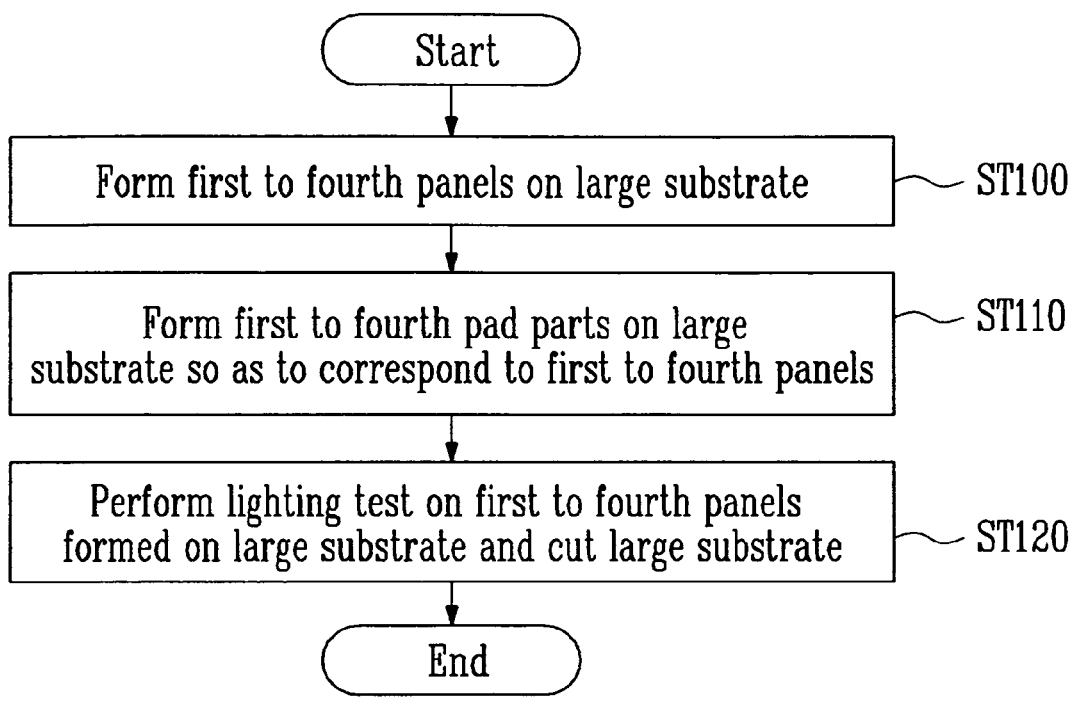
FIG. 4 is a flowchart showing a method of making an organic light emitting display device according to the present invention.

FIG. 4 is a flowchart showing a method of making an organic light emitting display device according to the present invention. Referring to FIG. 4, the organic light emitting display device making method will be described. First step ST100: first to fourth panels 100a, 100b, 100c, and 100d are formed on a large substrate 1000. The first and second panels 100a, 100b are formed on the top of the large substrate 1000 based on a long side thereof, and the third and fourth panels 100c, 100d are formed on the bottom of the large substrate 1000 based on a long side thereof.

Second step ST110: first to fourth pad parts 110a, 110b, 110c, and 110d are formed at positions corresponding to the first to fourth panels 100a, 100b, 100c, and 100d formed on the large substrate 1000. More specifically, the first and second pad parts 110a and 110b are formed on the top of the first and second panels 110a and 110b, respectively, and the third and fourth pad parts 110c and 110d are formed on the top of the third and fourth panels 110c and 110d, respectively. In other words, the first panel 100a receives the power supply and signals through the first pad part 110a, the second panel 110b receives the power supply and signals through the second pad part 110b, the third panel 100c receives the power supply and signals through the third pad part 10c, and the fourth panel 100d receives the power supply and signals through the fourth pad part 110d.

Third step ST120: a lighting test is performed on the first to fourth panels 110a, 110b, 110c, and 110d formed on the large substrate 1000 using the first to fourth pad parts 110a, 110b, 110c, and 110d, respectively, and then the large substrate 1000 is cut, allowing each panel to be used independently.

While the present invention has been described in connection with certain exemplary embodiments, it is to be understood that the invention is not limited to the disclosed embodiments but, on the contrary, is intended to cover various modifications and equivalent arrangements included within the spirit and scope of the appended claims, and equivalents thereof.

What is claimed is:

1. A method of making an organic light emitting display device, comprising the steps of:
    forming at least one first panel in a first region on a substrate and forming at least one second panel in a second region on the substrate, with the first and second regions being contiguous;
    forming independent pads, each independant pad receiving and transferring electrical power supplied from an exterior source onto the first and second panels formed on the substrate, the independent pads being equal in number to the panels; and
    forming independent wires between the panels and the independent pads;
    corresponding ones of the independent wires between the panels and the independent pads having a same length for each panel; and
    said independent pads connected to the first panel being formed on a side of the first panel with the side of the first panel being fartherest from the second panel, and said independent pads connected to the second panel being formed on a side of the second panel with the side of the second panel being fartherest from the first panel.

2. The method according to claim 1, wherein each of the independent pads independently transfers a same power supply and same driving signals to each of the panels.

3. The method according to claim 2, wherein images displayed on said at least one first panel formed on the top of the large substrate and images displayed on said at least one second panel formed at the bottom of the large substrate are symmetrical with each other in an upward and downward direction.

4. The method according to claim 1, further comprising the step of performing a lighting test on the panels using the pads.

5. The method according to claim 4, further comprising the step of cutting the large substrate, allowing each of the panels to be used independently.

6. A method of making an organic light emitting display device, comprising the steps of:
    forming first and second panels in a first region on top of a substrate, and forming third and fourth panels in a second region on top of the substrate, with the first and second regions being contiguous;
    forming a first pad corresponding to the first panel and first wires connecting the first panel to the first pad;
    forming a second pad corresponding to the second panel and second wires connecting the second panel to the second pad;
    forming a third pad corresponding to the third panel and third wires connecting the third panel to the third pad; and
    forming a fourth pad corresponding to the fourth panel and fourth wires connecting the fourth panel to the fourth pad;
    the first wires, the second wires, the third wires and the fourth wires having a same length; and
    said first and second pads being formed in the first region on a side of the first and second panels, respectively, fartherest from the second region, and said third and fourth pads being formed in the second region on a side of the third and fourth panels, respectively, fartherest from the first region.

7. The method according to claim 6, wherein the first, second, third and fourth pads receive a same power supply and same driving signals so as to transfer them to the first, second, third and fourth panels, respectively.

8. The method according to claim 7, wherein images displayed on the first and second panels and images displayed on the third and fourth panels are symmetrical with each other in upward and downward directions.

9. The method according to claim 6, further comprising the step of performing a lighting test on the panels using the pads.

10. The method according to claim 9, further comprising the step of cutting the large substrate, allowing each of the panels to be used independently.

* * * * *